United States Patent
Chang et al.

(10) Patent No.: US 6,744,121 B2
(45) Date of Patent: Jun. 1, 2004

(54) MULTI-CHIP PACKAGE

(75) Inventors: Cecil Chang, Pingduan (TW); Jansen Chiu, Kaohsiung (TW)

(73) Assignee: Walton Advanced Electronics LTD, Kaohsiung (TW)

( * ) Notice: Subject to any disclaimer, the term of this patent is extended or adjusted under 35 U.S.C. 154(b) by 0 days.

(21) Appl. No.: 09/837,271

(22) Filed: Apr. 19, 2001

(65) Prior Publication Data

US 2002/0153599 A1 Oct. 24, 2002

(51) Int. Cl.$^7$ ............................................... H01L 23/48
(52) U.S. Cl. ...................... 257/668; 257/723; 257/692
(58) Field of Search ................................ 257/668, 690, 257/685, 686, 692, 723, 777, 784; 361/723, 813

(56) References Cited

U.S. PATENT DOCUMENTS

| | | | | |
|---|---|---|---|---|
| 5,332,922 A | * | 7/1994 | Oguchi et al. ............... | 257/723 |
| 5,366,933 A | | 11/1994 | Golwalkar et al. .......... | 437/215 |
| 5,545,922 A | * | 8/1996 | Golwalkar et al. .......... | 257/676 |
| 5,757,080 A | * | 5/1998 | Sota ........................... | 257/777 |
| 5,793,108 A | * | 8/1998 | Nakanishi et al. ........... | 257/723 |
| 5,804,874 A | * | 9/1998 | An et al. ..................... | 257/686 |
| 5,986,335 A | * | 11/1999 | Amagai ....................... | 257/668 |
| 6,072,243 A | * | 6/2000 | Nakanishi .................... | 257/783 |
| 6,087,718 A | * | 7/2000 | Cho ............................. | 257/686 |
| 6,118,176 A | | 9/2000 | Tao et al. .................... | 257/676 |
| 6,175,149 B1 | * | 1/2001 | Akram ........................ | 257/676 |
| 6,177,721 B1 | * | 1/2001 | Suh et al. .................... | 257/686 |
| 6,225,683 B1 | * | 5/2001 | Yalamanchili et al. ....... | 257/666 |
| 6,252,299 B1 | * | 6/2001 | Masuda et al. ............. | 257/686 |
| 6,255,729 B1 | * | 7/2001 | Oikawa ....................... | 257/723 |
| 6,303,981 B1 | * | 10/2001 | Moden ........................ | 257/666 |
| 6,316,825 B1 | * | 11/2001 | Park et al. ................... | 257/686 |
| 6,340,846 B1 | * | 1/2002 | LoBianco et al. ........... | 257/783 |

* cited by examiner

Primary Examiner—Kamand Cuneo
Assistant Examiner—Lourdes Cruz
(74) Attorney, Agent, or Firm—Troxell Law Office PLLC

(57) ABSTRACT

A multi-chip package with a LOC lead frame is disclosed. Such a LOC lead frame has a plurality of leads, with each lead from inside to outside being divided into a first inner portion, a supporting portion, a second inner portion and an outer connecting portion. By bending the leads, the first inner portion, the supporting portion, and the second inner portion are formed on different planes. The first inner portion is sticking to the bottom chip and enables the electrical connection to the bottom chip. The supporting portion is sticking to the upper chip, while the second inner portion enables the bonding wires electrically connect the upper chip. This design can pack the upper and the bottom chips with a LOC lead frame without turnover action during wire-bonding.

3 Claims, 2 Drawing Sheets

MULTI-CHIP PACKAGE

RELATED APPLICATIONS

This invention is related to U.S. Ser. No. 09/837,255 entitled "Multi-Chip Package" filed on Nov. 19, 2002, now U.S. Pat. No. 6,483,181.

BACKGROUND OF THE INVENTION

1. Field of the Invention

The present invention relates to a multi-chip package, in particular about a multi-chip package comprising a LOC lead frame.

2. Description of the Related Art

In the past, a common making process of semiconductor devices use a lead frame to support and electrically connect to a semiconductor chip, and then seals the chip with a package body. To achieve higher performance and larger memory capacity, the semiconductor chip has become smaller and more accurate. An idea of stacking and sealing a number of semiconductor chips in the package body during packaging process has also been proposed. A manufacturing process of a multi-chip package has been claimed in the U.S. Pat. No. 5,366,933. As shown in FIG. 1, the multi-chip package 10 is used to seal the bottom chip 11 and the upper chip 12, wherein it comprises a bottom chip 11, an upper chip 12, a lead frame, a plurality of bonding wires 16 and 17, and a package body 18. This general type of lead frame comprises a plurality of leads 13 and a dice pad 14. Adhesive films 15 are applied to stick the bottom chip 11 and the upper chip 12 respectively to the bottom and the upper surface of the dice pad 14. A plurality of bonding wires 16 are further used to connect the bottom chip 11 and the leads 13 by wire-bonding technique, while a plurality of bonding wires 17 are used to connect the upper chip 12 and the leads 13 by wire-bonding technique as well. Because the bottom chip 11 and the upper chip 12 are adhesively stuck to the dice pad 14 with their back surface, an overturn action of the dual chip assembly is necessary during the wire-bonding process. To avoid compressing or scratching the bonding wires 16 during the second wire-bonding process, the manufacture processes of this multi-chip package 10 are in the order of sticking the bottom chip 11, forming bonding wires 16 to connect the bottom chip 11 and the lead frame, first time of molding and curing (the bottom part of the package body 18), sticking the upper chip 12, forming bonding wires 17 to connect the upper chip 12 and the lead frame, second time of molding and curing (the upper part of the package body 18). Nevertheless, such processes are not widely accepted under taking manufacturing efficiency and cost of molds development into consideration. Another type of multi-chip package is claimed in the U.S. Pat. No. 6,118,176. A LOC lead frame is used to support the upper chip and the bottom chip. The so-called LOC lead frame is the type of lead-on-chip lead frame for short. That is, the leads of the lead frame are extended on the chip for electrical connection and support of the chip without using the dice pad of the lead frame. Such a multi-chip package comprises a dual chip assembly with back-to-back sticking configuration, while the leads of the LOC lead frame are extend on the bottom surface of the bottom chip and fixed with an adhesive film. A circuit board is sticking on the upper surface of the upper chip, so as to enable the bonding wires to electrically connect the upper chip and the circuit board, as well as the circuit board and the leads. Likewise, the manufacture of such a multi-chip package must also involve an overturn action for wire bonding, the bonding wires on the bottom chip, however may be scratched during the wire-bonding process of the upper chip.

SUMMARY OF THE INVENTION

The main object of the present invention is a multi-chop package comprising a LOC lead frame to integrate the upper chip and the bottom chips. The leads of such a LOC lead frame are bend at various places, such that the first inner portion, the supporting portion and the second inner portion are respectively formed on different planes, so as to achieve the effect of packaging the upper and the bottom chip without the needs of overturn for wire-bonding.

In accordance with the multi-chip package in the present invention, it mainly comprises a LOC lead frame, an upper chip, a bottom chip, a plurality of bonding wires, and a package body. The LOC lead frame possesses a plurality of leads, with each lead from inside to outside being divided into the first inner portion, the supporting portion, the second inner portion, and the outer connecting portion. The first inner portion, the supporting portion, and the second inner portion are bent and formed on different planes. The bottom chip has a plurality of bonding pads on its upper surface and the bottom chip is fixed on the first inner portion of the leads of the lead frame with its upper surface. The upper chip possesses a plurality of bonding pads on its upper surface as well, and the upper chip is fixed on the supporting portion of the leads in the lead frame with its bottom surface. A plurality of first bonding wires electrically connect the bonding pads of the bottom chip and the first inner portion of the corresponding leads in the lead frame, while a plurality of second bonding wires electrically connect the bonding pads of the upper chip and the second inner portion of the corresponding leads in the lead frame. Besides, the package body seals the bottom chip, the upper chip, the bonding wires, and the first inner portion, the supporting portion, and the second inner portion of the lead frame.

DETAILED DESCRIPTION OF THE INVENTION

Figure 1:
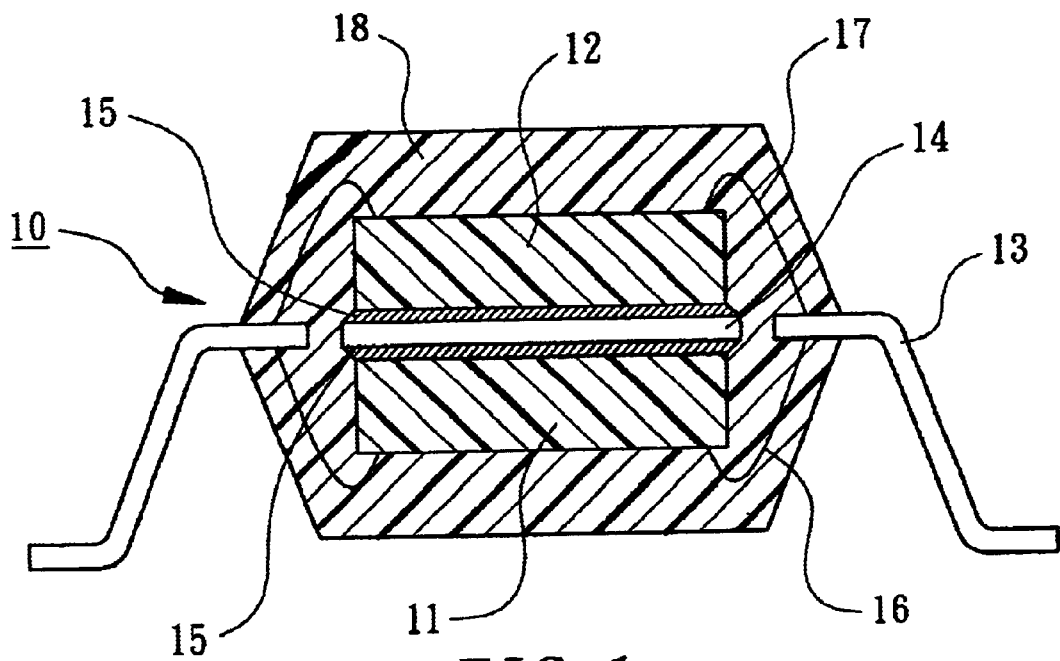
FIG. 1 is a cross-sectional view of a known multi-chip package.
Figure 2:
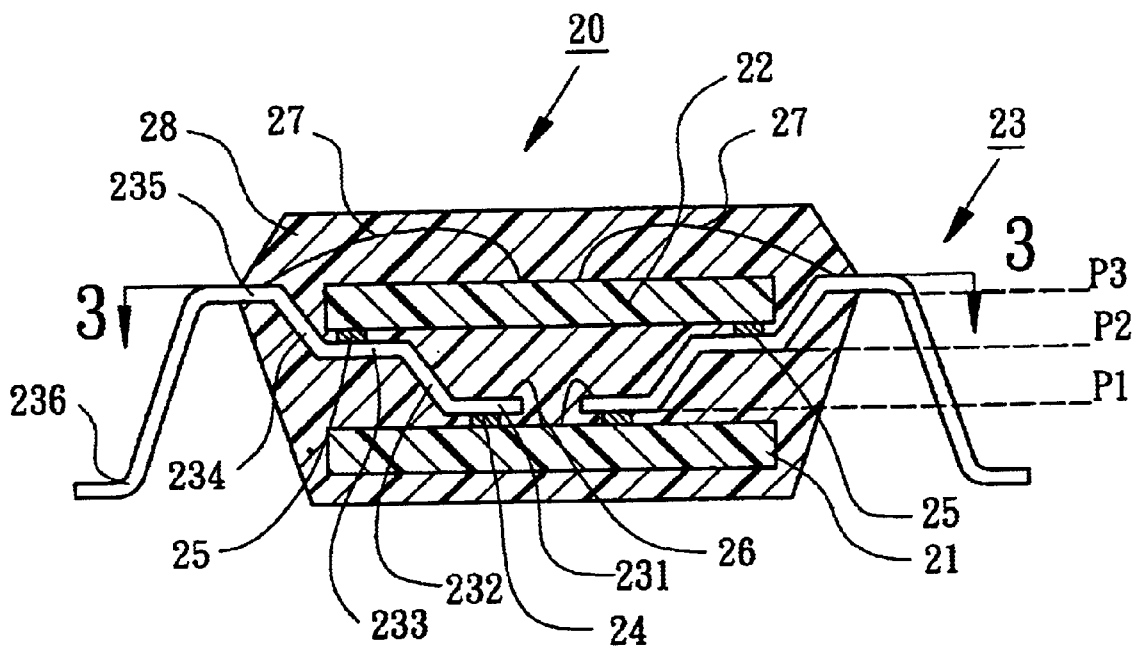
FIG. 2 is a cross-sectional view of the multi-chip package of the present invention.
Figure 3:
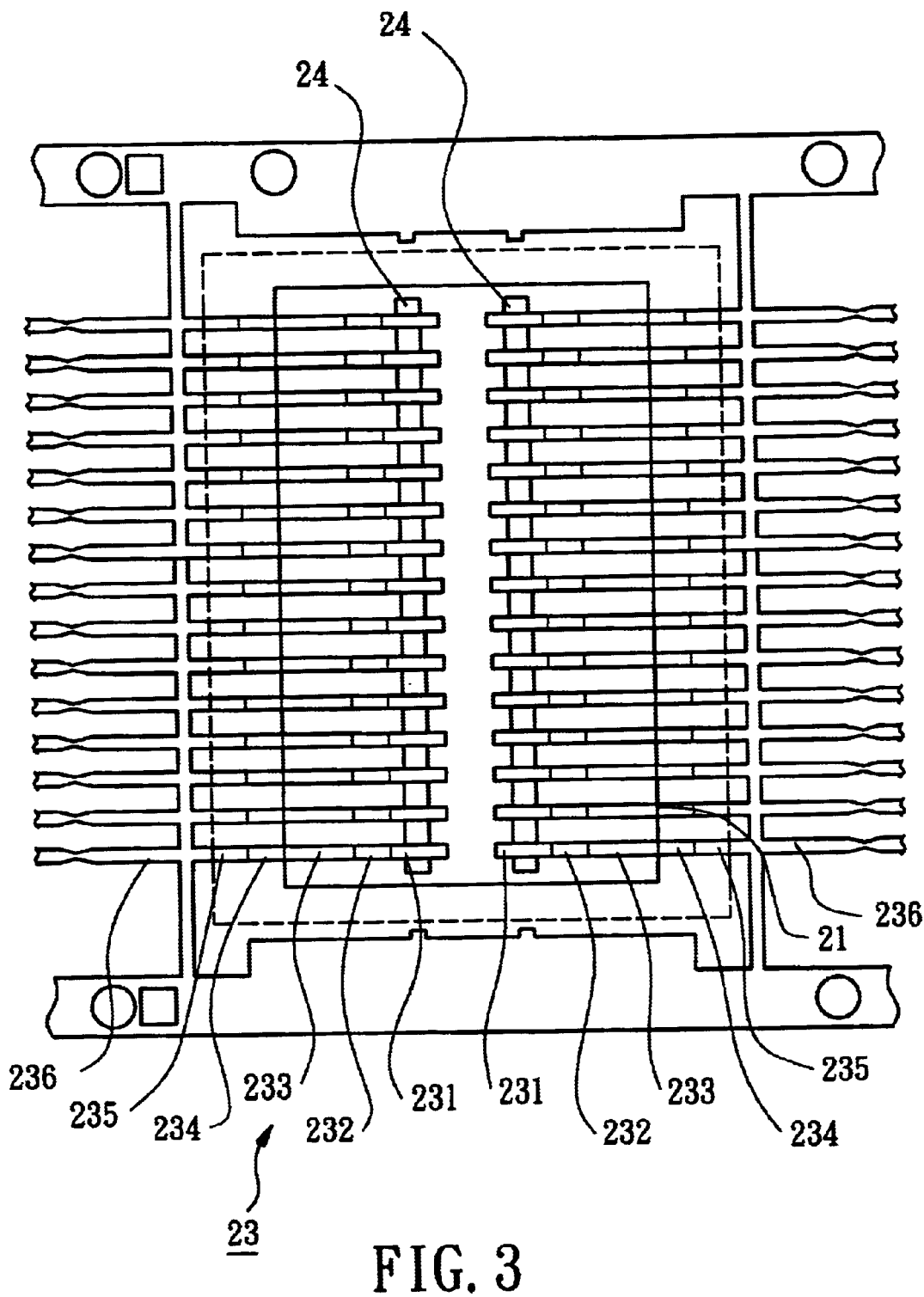
FIG. 3 is cross-sectional view of FIG. 2 taken on line 3—3 of FIG. 2.

Please refer to the attached drawings, the embodiments hereafter are listed to further explain the present invention:

FIG. 2 and 3 illustrate the first embodiment of the present invention, a multi-chip package 20 mainly comprises a LOC lead frame, a bottom chip 21, an upper chip 22, and a package body 28.

As shown in FIG. 2 and 3, the LOC lead frame is a type of 'Lead-On-Chip' lead frame. It can be made of a thin steel or copper board by applying common stamping and etching techniques. Such a LOC lead frame possesses a plurality of leads 23, with each lead 23 from inside to outside being divided into the first inner portion 231, the first bending portion 232, the supporting portion 233, the second bending portion 234, the second inner portion 235 and the outer connecting portion 236. The first inner portion 231, the first bending portion 232, the supporting portion 233, the second bending portion 234, and the second inner portion 235 are all inside the package body 28. The first inner portion 231 is used to electrically connect to and stick the bottom chip 21, while the supporting portion 233 is used to support the upper chip 22. The second inner portion 235 is used to electrically connect the upper chip 22, while the outer connecting portion 236 is used as the outer ends of the multi-chip package 20. The first bending portion 232 makes the first inner portion 231 and the supporting portion 233 not located on the same plane. As shown in FIG. 2, the first inner portions 231 of a plurality of leads 23 are formed on the first plane P1, while the supporting portions 233 of the leads 23 are formed on the second plane P2. The first plane P1 and the second plane P2 are two different planes and are parallel with each other, the height difference between these two planes can avoid the upper chip 22 compressing the first bonding wire 26 on the bottom chip 21. Likewise, the existence of the second bending portion 234 can lead to the result where the supporting portion 233 and the second inner portion 235 are not on the same plane. As shown in FIG. 2, the supporting portion 233 of a plurality of leads 23 is formed on the second plane P2, while the second inner portion 235 of a plurality of leads 23 is located on the third plane P3, such that the second plane P2 and the third plane P3 are two different planes and are parallel with each other. The downset area caused by the second plane P2 and the third plane P3 can increase the height of the second inner portion 235 (i.e., to decrease the height difference between the upper surface of the upper chip 22 and the second inner portions 235 of the leads 23.), so as to enable the second bonding wires 27 to electrically connect the bonding pads on the upper surface of the upper chip 22 and the second inner portions 235 of the corresponding leads 23. This structure can avoid the .second bonding wires 27 inappropriately contacting the edge of the upper surface of the upper chip 22.

The bottom chip 21 is fixed beneath the first inner portion 231 of the above-mentioned leads 23. The upper surface of the bottom chip 21 is sticking beneath the first inner portions 231 of the leads 23 with the first adhesive tape 24, which is made of insulating materials like polyimide, or other adhesives. The bottom chip 21 commonly comprises a plurality of bonding pads and integrated circuit elements on its upper surface (not illustrated in drawings). The bottom chip 21 can be one kind of memory chips like DRAM (Dynamic Random Access Memory), SRAM (Static Random Access Memory) and flash memory, or microprocessor, chip with logic functions. Besides, the electrical connection between the upper chip 21 and the lead frame is achieved by a plurality of bonding wires 26, made of gold or copper, connecting the bonding pads of the bottom chip 21 and the first inner portion 231 of the corresponding leads 23 of the lead frame by wire-bonding techniques.

The upper chip 22 can be the same as the bottom chip 21 or any other functional chips, and the two chips are preferred to be of the same size. The upper chip 22 is fixed on the top of the supporting portion 233 of the above-mentioned leads 23. The bottom surface of the upper chip 22 is sticking to the supporting portion 233 of the leads 23 with the second adhesive tape 25, which is made of insulating material like polyimide or other adhesives. The upper surface of the upper chip 22 commonly possesses a plurality of bonding pads and integrated circuit elements (not illustrated in drawings). A plurality of second bonding wires 27 connect the bonding pads of the upper chip 22 and the second inner portions 235 of the corresponding leads 23 of the lead frame by wire-bonding techniques. The upper surface of the upper chip 22 is preferred not to exceed the height of the second inner portion 235 of the leads 23. Besides, the package body 28 of the multi-chip package 20 is used to seal the bottom chip 21, the upper chip 22, the first adhesive tape 24, the second adhesive tape 25, the bonding wires 26, 27, and the first inner portions 231, the first bending portions 232, the supporting portions 233, the second bending portions 234, and the second inner portions 235 of the leads 23 but to expose the outer connecting portions 236, so that to protect the above double-sided chip package 20. Therefore, the multi-chip package 20 of the present invention is capable of packaging at least two chips, while the use of the LOC lead frame makes the two chips parallel with each other in vertical directions, so as to decrease the footprint of the multi-chip package 20. In the meantime, since the bonding pads of the upper and the bottom chips are facing the same direction (the upper surface), the steps of the manufacturing process are in the order of sticking the bottom chip 21, wire-bonding the bottom chip 21, sticking the upper chip 22, wire-bonding the upper chip 22, and molding. The advantage is that no turn-over action is required.

The protection scope of the present invention must refer to the appended claim. Any change or modification, by anyone familiar with the technique, without departing from the spirit of the present invention, is within the scope of the claims.

What is claimed is:

1. A multi-chip package comprising:
   a LOC lead frame with a plurality of leads, each lead having a first inner portion, a supporting portion, a second inner portion and an outer connecting portion in sequence, wherein the first inner portions of the leads are formed on a first plane, the supporting portions of the leads are formed on a second plane spaced above the first plane, and the second inner portions of the leads are formed on a third plane spaced above the second plane;
   a bottom chip having first upper surface with a plurality of bonding pads formed on the first upper surface, and the upper surface of the bottom chip being fixed beneath the first inner portions of the leads;
   an upper chip having a second upper surface with a plurality of bonding pads formed on the second upper surface, and a bottom surface of the upper chip is attached to a top of the supporting portions of the leads, such that the second upper surface is substantially located in the third plane;
   a plurality of first bonding wires electrically connecting the bonding pads of the bottom chip and the first inner portions of the corresponding leads;
   a plurality of second bonding wires electrically connecting the bonding pads of the upper chip and the second inner portions of the corresponding leads; and
   a package body sealing the upper chip, the bottom chip, the bonding wires, and the first inner portions, the supporting portions and the second portions of the leads.

2. The multi-chip package in accordance with claim 1, further comprising a first adhesive tape on the first inner portions of the leads for fixing the bottom chip to the first inner portion of the leads.

3. The multi-chip package in accordance with claim 1, further comprising a second adhesive tape on the supporting portions of the leads for fixing the upper chip to the supporting portions of the leads.

* * * * *